United States Patent [19]
Bacot et al.

[11] Patent Number: 5,235,687
[45] Date of Patent: Aug. 10, 1993

[54] METHOD FOR REPLACING MEMORY MODULES IN A DATA PROCESSING SYSTEM, AND DATA PROCESSING SYSTEM FOR PERFORMING THE METHOD

[75] Inventors: Pierre Bacot, Chaville; Guy Magnaud, Maule; Jean-Jacques Pairault, Boulogne Billancourt, all of France

[73] Assignee: Bull S. A., Paris, France

[21] Appl. No.: 487,269

[22] Filed: Mar. 2, 1990

[30] Foreign Application Priority Data

Mar. 3, 1989 [FR] France ................ 89 02751

[51] Int. Cl.$^5$ ............................ G06F 11/20
[52] U.S. Cl. ................ 395/425; 371/10.1; 371/21.1; 364/245.3; 364/DIG. 1; 364/961; 364/DIG. 2
[58] Field of Search ............... 364/200, 900, 245.3, 364/DIG. 1, 961, DIG. 2; 371/10.1, 9.1, 21.1, 21.5, 40.2, 31; 395/425

[56] References Cited

U.S. PATENT DOCUMENTS

| | | | |
|---|---|---|---|
| 4,093,985 | 6/1978 | Das | 364/200 |
| 4,150,428 | 4/1979 | Iurig et al. | 364/200 |
| 4,342,079 | 7/1982 | Stewart et al. | 364/200 |
| 4,345,319 | 8/1982 | Bernardini et al. | 365/230.03 |
| 4,456,966 | 6/1984 | Bringol et al. | 364/900 |
| 4,584,681 | 4/1986 | Singh et al. | 371/10.1 |
| 4,872,166 | 10/1989 | Jippo | 371/10.1 X |
| 5,007,053 | 4/1991 | Iyer et al. | 371/21.1 |

FOREIGN PATENT DOCUMENTS

| | | |
|---|---|---|
| 0076629 | 4/1983 | European Pat. Off. . |
| 0078942 | 5/1983 | European Pat. Off. . |
| 0141245 | 8/1987 | European Pat. Off. . |
| 2273320 | 12/1975 | France . |
| 2291544 | 6/1976 | France . |

OTHER PUBLICATIONS

Hendrie, G. "A hardware solution to part failures totally insulates programs", *Electronics International*, vol. 56, No. 2, Jan. 27, 1983, pp. 103–105.

*Primary Examiner*—Michael R. Fleming
*Assistant Examiner*—Glenn A. Auve
*Attorney, Agent, or Firm*—Kerkam, Stowell, Kondracki & Clarke

[57] ABSTRACT

The invention relates to the field of data processing systems and provides a method and system to enable replacement of memory modules ($MU_i$) connected to a bus (MB) without interrupting the functioning of the system, wherein for any writing request addressed to a module to be replaced ($MU_i$), this writing request is executed simultaneously and at the same address by the module to be replaced ($MU_i$) and by a replacement module ($MU_r$), and for any reading request addressed to the module to be replaced ($MU_i$), only the module to be replaced ($MU_i$) is authorized to execute this reading request. Next, a recopying process is started which includes sending reading and rewriting requests to a set of addresses covering the entirety of the memory space of the module to be replaced ($MU_i$).

29 Claims, 6 Drawing Sheets

1

METHOD FOR REPLACING MEMORY MODULES IN A DATA PROCESSING SYSTEM, AND DATA PROCESSING SYSTEM FOR PERFORMING THE METHOD

RELATED APPLICATION

This application is related to application Ser. No. 444,941 for ELECTRONIC SYSTEM WITH A PLURALITY OF REMOVABLE UNITS of Claude AHN et al., filed Dec. 4, 1989, and corresponding to French application No. 88.16194 filed Dec. 8, 1989. The subject matter of said application is hereby incorporated by reference.

FIELD OF THE INVENTION

The invention pertains to the field of data processing systems and more particularly relates to problems in improving the availability of these systems.

BACKGROUND OF THE INVENTION

For a long time, engineers have sought to improve system reliability. Major progress has been made, particularly through more-reliable components. Suitable logical and technological organization of the system provides another way of avoiding errors even if these components become defective.

However, regardless of how effective the means used are, the possibilities of masking defects by error correction are not unlimited. This limitation becomes particularly critical when the complexity of the system increases.

To overcome this problem, the idea of providing the ability to replace defective elements in the system has arisen.

It will be appreciated that the disturbance caused by such repairs must be kept to a minimun, because it affects the availability of the system.

In addressing the problem of availability, the various elements that comprise a data processing system must be considered. A system essentially includes a certain number of units of three types: processors, memory modules, and input-output controllers. Generally, a plurality of processors that communicate via a bus with a plurality of memory modules are provided. The processors can be connected to the bus directly, or via a controller serving as an interface. To enable communication with the outside, the processors are also connected to one or more input-output units. These essential elements are generally also accompanied by a maintenance device, typically known as a "service processor", which is used for initializing the system and for maintenance, for example for taking errors detected in the various units into account.

In a system with multiple elementary processors (that is, a multiprocessor system), the failure of one of the processors does not necessarily cause the immediate interruption of the system. In fact, if persistent errors in a processor are detected by the service processor, then the service processor can logically disconnect the defective processor. As a result, the system can continue to function using the remaining processors, although with some degradation in performance. The maintenance service must later replace the defective processor with a replacement processor and must effect its logical reconnection. These operations are feasible, because current systems are typically designed to be capable of reconfiguration.

In a well-designed system, the failure of a processor and its replacement do not engender major visible disturbance to the user. In fact, because of redundancy, functioning is not interrupted, and the process being executed in the defective processor at the moment of the failure can be re-executed. The failure of a memory module, contrarily, presents an entirely different problem, because the defective module may contain data that are impossible to reconstruct. The problem may be even more serious, if the data relate to the system itself. Even if the operating system is designed so that the contents of the memory are periodically saved in external memories, a module containing the most recently updated data may fail before a save operation of this kind has been executed.

To reduce this risk, current memory modules include a plurality of components, such that each of the bits comprising one technological word are stored in a different component. This makes the probability of failure in any two bits of a word equal and independent, thereby enabling the use of a self-correcting mode of the Hamming type, memorized in supplementary components. Thus the failure of one or more components can be detected and corrected.

However, over the life of the module, the failures may accumulate until it is no longer possible to correct them. Hence the module is suitably replaced, before this limit is reached. Nevertheless, it must be noted that useful data may be memorized in that module. To the extent that the operating system permits, one solution may comprise recopying the contents of the defective module into an external memory. After replacement of the module, the saved data is reloaded. However, this solution is difficult to implement, particularly in the case where the defective module contains elements of the operating system.

Another solution may comprise transferring the data from the defective module to one or more other modules of the system. However, that method necessitates a reallocation of memory space, which means a complication of the software that has to manage the tables for address correspondence for the memory space involved.

OBJECT AND SUMMARY OF THE INVENTION

The object of the invention is to propose a simple solution for replacement of memory modules, while disturbing the operation of the system as little as possible. More precisely, the subject of the invention is a method for performing the replacement of one or more memory modules of a data processing system, in which the modules communicate with the processing means of the system via a bus, and the bus is provided with connection sites to which the modules are connected, the method being characterized in that it comprises:

a) providing at least one supplementary connection site, in addition to the connection sites necessary for the system in its normal configuration, b) when a module to be replaced is identified, connecting a replacement module to one of the supplementary connection sites, c) for any writing request addressed to the module to be replaced, executing the writing request simultaneously and to the same address by the module to be replaced and by its replacement module, and for any reading request addressed to the module to be replaced, authorizing only the module to be replaced to execute the reading request, d) starting a recopying process by sending said reading requests and then said rewriting requests to a set of addresses covering the entirety of the memory space of the module to be replaced, e) once the recopying process is completed, for any later request addressed to the module to be replaced, authorizing only the replacement module to execute the later request, at the same address.

It is important to note that this method makes it possible for the recopying process to be executed concurrently with other programs being run in the system. In fact, during the entire recopying period, all the requests addressed to the module to be replaced can be satisfied without any need to wait until the recopying is finished. By comparison, with conventional methods performing a generally manual memory reconfiguration, the programs in the module involved must be rerun.

Thus to profit from this capability and in accordance with an additional characteristic of the invention, the recopying process can be executed in parallel with other programs being run in the system at the time.

Executing the recopying process requires that any reading request intended for the module to be replaced be executed only in this module to be replaced, rather than in the replacement module. To attain this, it could be provided that the reading requests be transmitted solely to the module to be replaced. Although that solution is conceivable, it presents difficulties of implementation in the following case: When the recopying process is completed, the replacement module will change its status and become a "titular" module. Beginning at the moment when this change of status takes place, the reading and writing operations addressed to the module to be replaced must normally be executed by the replacement module. Simultaneously, the module to be replaced must not execute any other request. Executing a reading request generally requires several operative phases. Consequently, with the method planned here, the change in status must be prevented from taking place during a reading operation. To accomplish this, a mechanism may be provided to authorize changes in status only outside reading periods, but that would result in a more complicated implementation.

To overcome this disadvantage, and according to another particular feature of the invention, any reading or writing request during the entire recopying process is sent simultaneously to both the module to be replaced and the replacement module; and in the case of a reading request, the two modules access the data to be read normally, but transmission of the accessed data by the replacement module is inhibited.

Thus even if a change in status takes place during a reading operation, this operation will be performed correctly.

In another characteristic of the invention, any replacement module is marked by a mode indicator signalling the status of this module as a replacement, and that the inhibition is conditioned by the presence of the mode indicator.

In conventional systems that include a plurality of memory modules, a reading or writing operation is typically initialized by the transmission of a selection signal, generated from an address, to the module concerned. Hence these systems are provided with a selection circuit that as a function of the logical address furnished by one of the processors issues one selection signal among n, where n is the number of modules. For implementation of the invention, the selection circuit must be modified, but advantageously in as simple a manner as possible. To do so, the conventional circuit is re-used, but its signals are no longer transmitted directly to the modules. They serve as intermediate signals, called "logical selection signals", which make it possible to define visible "logical" modules at the software level. Next, a correspondence between the logical module and the physical module is performed at the hardware level by a conversion of the logical signals into physical signals. During normal operation, this correspondence will be biunivocal. Contrarily, during a recopying process, two physical signals transmitted simultaneously to the module to be replaced and to the replacement module will correspond to one logical signal.

More precisely, and in an another feature of the invention, the method is characterized in that the system includes n modules in its normal configuration and any request activates one signal among n, called a "logical selection signal", as a function of the associated address, and that each module is effectively connected to the bus being capable of being commanded by a selection signal called a "physical selection signal", and in order to enable simultaneously selecting two modules in response to a predetermined request, the logical selection signal associated with the predetermined request activates two physical selection signals simultaneously, which are applied respectively to the two modules.

The invention also relates to a data processing system enabling the implementation of the above-described method. The system according to the invention includes processing means connected to a plurality of memory modules via a bus which is provided with connection sites to which the modules are connected. The system also includes command means to select the modules, in response to the addresses associated with memory access requests issued by the processing means, and a maintenance device is also connected to the system. The system is further characterized in that:

a) in addition to the connection sites necessary for the system in its normal configuration, at least one supplementary connection site is provided, for receiving replacement modules there, b) to be capable of performing the replacement of a module with another, the command means can be set by the maintenance device such that:

any writing request addressed to a module to be replaced is executed at the same time and at the same address by both the module to be replaced and an associated replacement module and any reading request addressed to the module to be replaced is executed by only the module to be replaced, c) the system includes means for execution, on the command of the maintenance device, of a recopying process by sending said reading requests and then said rewriting requests to a set of addresses covering the entirety of the memory space of the module to be replaced.

In a particular embodiment, the system is characterized in that the means for executing the recopying process comprise a program or microprogram loaded into the processing means, and that the program or microprogram can be executed in parallel with other programs being run at that time in the processing means.

Further characteristics and details of embodiments for implementing the invention will be explained in the ensuing detailed description, taken in conjunction with the drawings.

DESCRIPTION OF THE PREFERRED EMBODIMENTS

Figure 1:
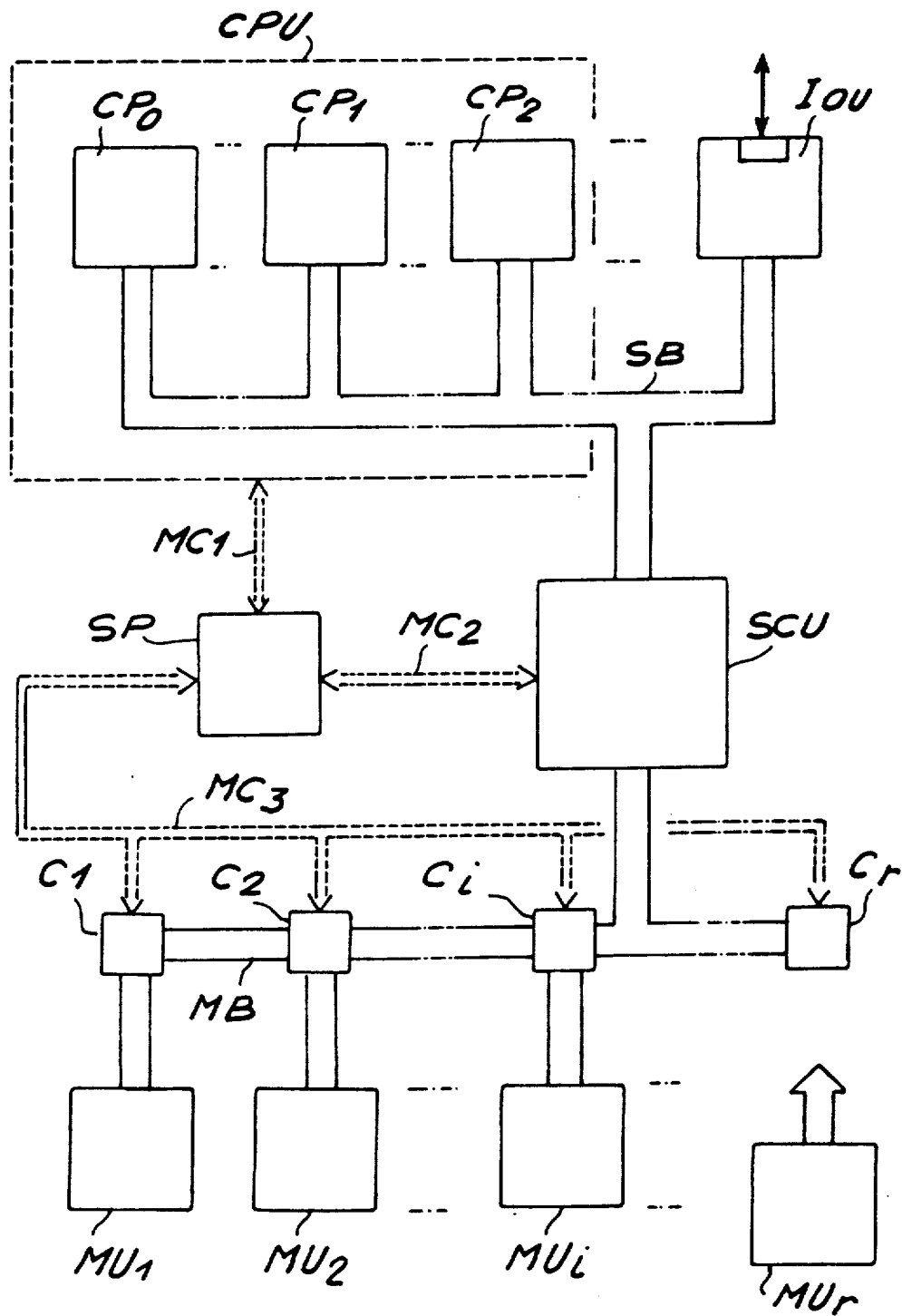
FIG. 1 schematically shows a data processing system for implementing the invention.

FIG. 1, in a nonlimiting example, shows a data processing system serving to illustrate the scope of the invention. The system described is a multiprocessor system, the processing means CPU of which are formed by a plurality of elementary processors $CP_0, \ldots, CP_1, \ldots, CP_2$. Each of these processors is connected to a system bus SB in such a way as to be capable of communicating with the other units. One or more input-output units IOU are likewise connected to the system bus SB. The system on the other hand includes a memory comprising a plurality of memory modules $MU_1, MU_2, \ldots, M_i, \ldots, MU_r$, connected to a memory bus MB by connection sites $C_1, C_2, \ldots, C_i, \ldots, C_r$, respectively. To enable the exchanges of information between the elementary processors and the memory modules, the system bus SB is connected to the memory bus MB via a memory controller SCU. The functions of the memory controller SCU are on the one hand to centralize the requests originating in the elementary processors, and on the other to exchange command and control signals with the memory modules to perform the reading and writing operations requested by the processors.

The above assembly, which is called a "central subsystem", is associated with a maintenance device essentially including a service processor SP serving in particular to initialize the system and perform maintenance operations. The service processor includes display and command means enabling dialog with a user. For executing certain maintenance operations, the service processor SP is connected to the various units CPU, SCU, $MU_i$ by maintenance lines $MC_1, MC_2, MC_3$, respectively. These lines are connected to maintenance circuits (not shown) contained in the units. These maintenance circuits are designed to perform diagnostics and to execute maintenance operations in the units commanded by the service processor. The service processor may also be connected to the system in the same manner as a terminal. This kind of connection (not shown) makes it possible to start test programs and in particular reading and rewriting programs for performing recopying processes.

To this extent, the system according to the invention is not physically different from a conventional system except in the existence of supplementary connectors CR, the use of which is reserved for the operations of replacement of memory modules.

The system that has just been described includes a separate bus MB assigned to the memory. Nevertheless, it should be noted that the invention could also apply to a system provided with a single bus shared by the processors, the input-output units and the memory modules.

Figure 2:
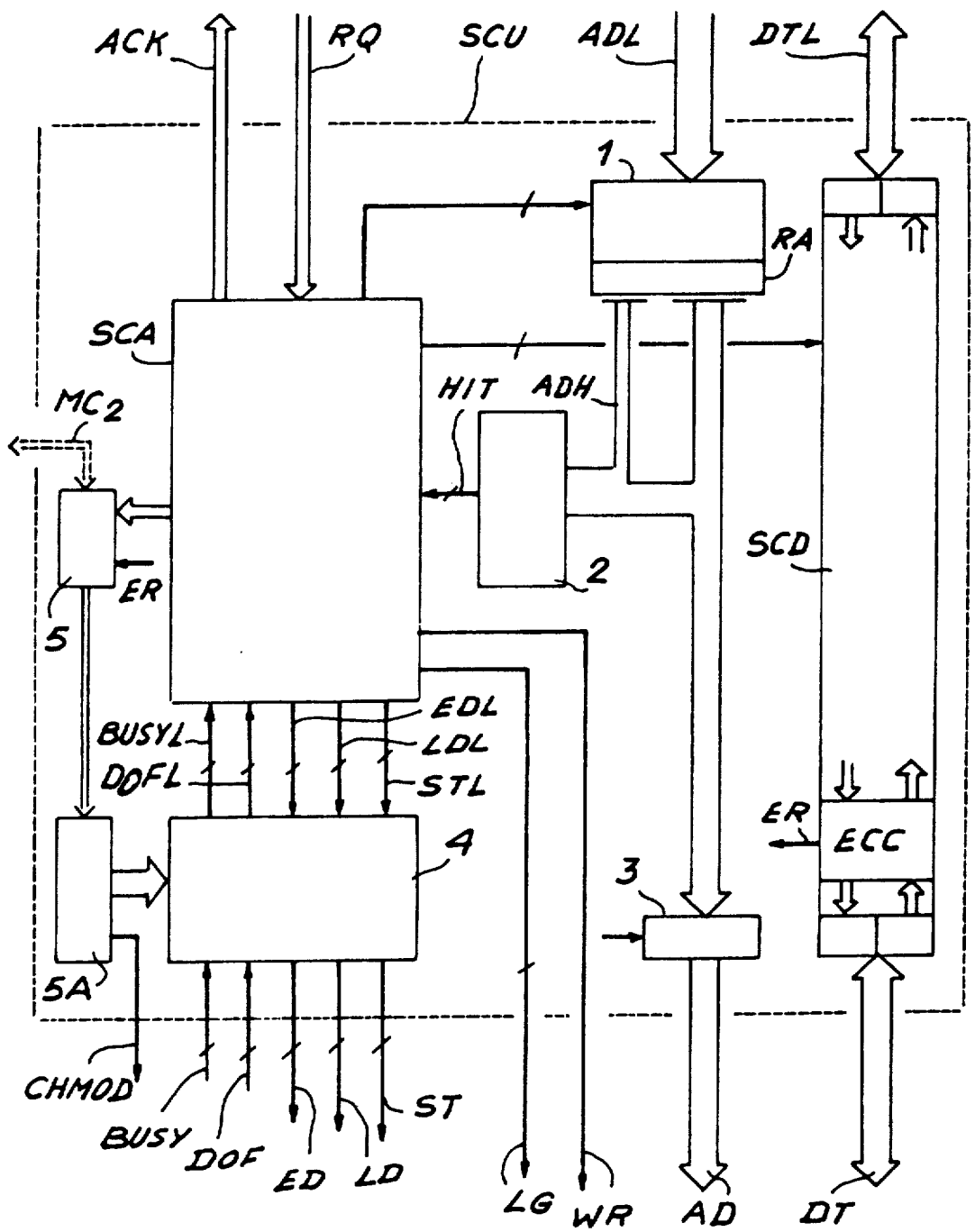
FIG. 2 shows the organization of a memory controller of the system according to the invention.

FIG. 2, in greater detail, shows the memory controller SCU and its connections with the system bus SB, on the one hand, and the memory bus MB, on the other.

In the conventional manner, the controller SCU exchanges command signals RQ and response signals ACK, address signals ADL and data DTL with the processors, via the system bus SB. On the other hand, the controller SCU sends selection signals ST, command signals ED, LD, WR, LG and the address signals AD inside the modules to the memory modules. It receives the control signals BUSY, DOF from the modules and exchanges the data DT with them.

In a particular embodiment of the invention, the controller SCU likewise issues a change of mode signal CHMOD, which will be explained in detail below.

It should be noted that the invention is certainly applicable to any type of system buses, such as a message bus.

In the example described, the signals exchanged with the memory modules can be classified in two categories: the signals AD, DT, LG, WR, CHMOD that are common to all the modules, and the signals ST, ED, LD, BUSY, DOF, which relate to only a single module. The latter signals are carried by as many lines as there are modules that can be connected to the memory bus. For example, the selection lines ST comprise the lines $ST_1, ST_2, \ldots, ST_i, \ldots, ST_r$, which are connected respectively to the connectors $C_1, C_2, \ldots, C_i, \ldots, C_r$.

To implement the invention, the controller SCU must be capable of selecting a plurality of modules simultaneously for the same request. Contrarily, in a conventional system, the controller can select only one module at a time. For the sake of simplicity of embodiment, the solution proposed seeks to retain the majority of elements constituting a conventional controller and add to them a supplementary circuit to permit simultaneous selections.

In the controller SCU, three principal conventional sub-assemblies are distinguished initially: a data transmission circuit SCD, address processing circuits 1, 2, 3, and a command circuit SCA. The supplementary circuit mentioned above is a circuit 4 for converting signals exchanged among the modules and the command circuit SCA. To these functional circuits are added maintenance circuits 5, 5A connected to the service processor SP by the maintenance lines $MC_2$, which for example comprise a serial link.

With this selection in terms of embodiment, for each type of non-shared signals exchanged between the command circuit SCA and the modules (selection, command, control), a single signal among n, where n is the number of modules of the system in its normal configuration, is active at a time. In a conventional system, these signals are exchanged directly with the modules. Contrarily, in the invention, the non-shared signals originating from and received by the command circuit SCA must undergo a conversion and thus will be designated as "logical" signals. By analogy, the associated "logical" modules will be defined as those that would correspond to the real or "physical" modules involved with these signals in the case of a conventional system.

Thus the command circuit SCA issues the logical selection signals STL, and the logical command signals EDL, LDL, and receives the logical control signals BUSYL, DOFL. Corresponding to these logical signals, after conversion, are the signals ST, ED, LD, BUSY, DOF, respectively, that are effectively exchanged with the physical modules; these signals can be designated as "physical" signals. It will be understood that the shared signals WR, LG, as well as AD and DT do not fit this distinction, and when the system is in a normal configuration, the conversion circuit 4 establishes a simple biunivocal correspondance between each logical signal and a unique physical signal.

The controller of FIG. 2 and its functioning will now be described in greater detail.

The requests originating from the processors arrive in the form of command signals RQ accompanied by address signals ADL and data signals DTL in the case of writing.

In response to these requests and as a function of the state of the controller, the circuit SCA furnishes response signals ACK. The address processing circuit is commanded by the circuit SCA and includes an input buffer 1 connected to the address lines ADL of the bus SB and an output buffer 3 connected to the address lines AD of the bus MB. The input buffer 1 may comprise a plurality of registers, each register being dedicated to one processor or one input-output controller of the system. The data transmission circuit SCD likewise commanded by the circuit SCA connects the data lines DTL of the system bus SB to the data lines DT of the memory bus MB, via an error detection and correction circuit ECC. The circuit ECC, which may be of the conventional type, issues error detection signals ER. The outputs of the input buffer 1 are connected selectively to an associative logical configuration table 2 serving to establish the correspondance between the addresses received, ADL, and the logical modules to be selected. The correspondance takes material form in coincidence signals HIT transmitted to the command circuit SCA. As a function of the command signals RQ and coincidence signals HIT, the command circuit SCA can generate logical selection signals STL and logical command signals EDL, LDL, which serve to control the memory modules. The circuit SCA also receives logical control signals BUSYL, DOFL, which represent the state and responses of the modules.

The controller SCU also issues the signal WR, the logical value of which indicates whether reading or writing is involved. It also furnishes the signal LG indicating the length of the transfer. These signals WR, LG are issued by the command circuit SCA and are applied to the modules without conversion.

The controller SCU includes a maintenance interface circuit 5 serving on the one hand to memorize and transmit the commands originating in the service processor and on the other to memorize and transmit accounts of errors relating to the controller, under the command of the service processor. In particular, the circuit 5 commands the maintenance circuit 5A to set the conversion circuit 4 and generate the CHMOD signal already mentioned.

With the exception of the conversion circuit 4, the elements comprising the controller SCU are of the standard type in the art of memory controllers. Hence these elements need not be described in detail, because their embodiment is within the competence of one skilled in the art. Accordingly, the present description will be limited to the essential functions of the controller with respect to the main signals exchanged with it, so as to better place the invention in its context. It is understood that the controller described here must be considered only as an example, and numerous variant embodiments of the controller are possible without departing from the scope of the invention.

In the example in question, the controller SCU serves as an interface between a plurality of processors and a plurality of memory modules. In addition to the role of a memory controller per se, the controller SCU also has a function of centralization of requests originating in the processors. To perform it, the requests in question are placed in queues managed by the circuit SCA. For each logical module, one queue is provided, capable of memorizing as many requests as the system includes processors and input-output units. In response to the requests received and as a function of the availability of the memory modules in question, the circuit SCA starts the execution of the operations of reading or writing at the level of the modules by sending logical selection and command signals, accompanied by or followed by address information AD and data DT. The possible availability of the destination module for the request is taken into account by the command circuit SCA by means of a busy signal that appears on one of the lines BUSYL. In this case, the circuit SCA keeps the request waiting in the buffer memory of the queue associated with the module until the module is free.

If a destination module for a request that is waiting becomes available, one of the signals BUSYL changes its state, for example by assuming the value of logical 0, and the request can be executed. Parallel to the updating of the queue, the circuit SCA then activates one of the logical selection signals STL, which in turn activates a signal ST. It also places the address AD in the output register 3. The lines LG are placed on a logical profile representing the length of the transfer. Finally, depending on whether the request is for reading or writing, the signal WR is set to the value of logical 0 or 1. The preceding signals are received by the module in question, which is then in a condition to execute the request.

In the case of reading, the availability of the data read in the module is signaled to the command circuit SCA by one of the signals DOF converted into a logical signal DOFL. When the circuit SCA is ready to receive the data, it brings about the activation of one of the signals ED received by the module in such a way as to authorize it to transmit the data. The data are then loaded into the input buffer of the circuit SCD. These data are then transmitted via the ECC circuit to the output buffer next to the system bus. In the event of a detected error, the circuit ECC validates the signal ER, which is taken into account by the circuit 5.

In the case of writing, when the data are present in the output buffer of the circuit SCD, the command circuit SCA, via one of the signals LDL, activates one of the signals LD, which is transmitted to the module to authorize it to take the data DT present in the memory bus into account.

The above explanation relates to normal memory access.

To implement the invention, the conversion circuit 4 is designed to permit the simultaneous execution of writing operations in a module to be replaced and in a replacement module. In addition, the conversion circuit 4 must include or be associated with means which authorize only the module to be replaced to execute the reading operations.

A detailed description of the circuit 4 and of the associated means will be given hereinafter, but before that, reference should be made to FIG. 3, in order to describe the means making it possible to generate the logical signals that this circuit receives.

Figure 3:
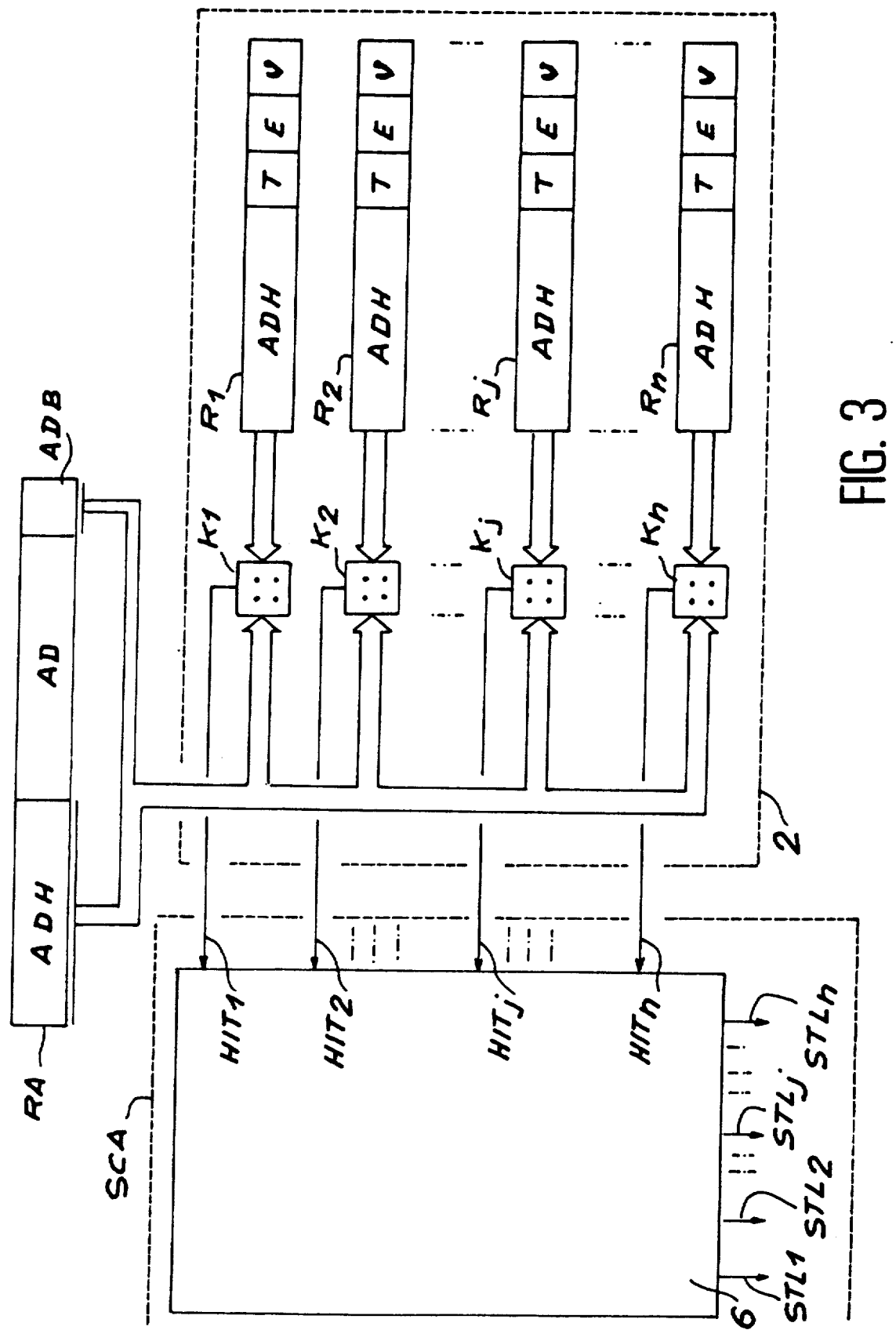
FIG. 3 shows means of the memory controller for generating the logical selection signals.

FIG. 3 shows an associative logical configuration table 2 associated with a logical selection circuit 6 that is part of the circuit SCA. To execute a reading or writing request, the controller SCU places the associated address ADL in an address register RA. The address ADL may be subdivided into three main fields: the field ADH formed of the most significant bits of the address, the field ADB formed of the least significant bits, and the field AD formed of the remaining bits. The associative table 2 includes n logical configuration registers $R_1, R_2, \ldots, R_j, \ldots, R_n$, where n is the number of logical modules, or in other words modules that comprise the memory in its normal configuration. Each register Rj contains a plurality of information fields ADH, T, E, V, the values of which are specific to an associated logical module. The first field ADH is assigned to the most significant bits of the addresses assigned to the module. If the modules are capable of having different sizes, the field T is assigned the size of the module. A field E may also be provided to contain a datum representing the type of interlacing used. A final field U is normally provided to contain a validity bit for the logical module.

To establish the correspondence between a received address ADL and the logical module j in question, the contents of each register are compared with the most significant bits ADH and the least significant bits ADB of the address. These comparisons are performed in the comparators $K_1, K_2, \ldots, K_j, \ldots, K_n$, and for a given logical address, normally only one of these circuits activates one of the coincidence signals $HIT_1, HIT_2, \ldots, HIT_j, \ldots, HIT_n$, making it possible to identify the logical module j assigned to the address. As a function of the coincidence signals $HIT_j$, the logical selection circuit 6 can activate one of the logical selection signals $STL_1, STL_2, \ldots, STL_j, \ldots, STL_n$. In normal functioning, only one of the logical selection signals $STL_j$ is active, for example assuming the value of logical 1. It is understood that this logical selection signal is activated only on the condition that the logic module is question is available.

The coincidence signals $HIT_j$ are also used by the command circuit SCA to select which of the signals LDL or EDL described above must be activated. As already noted above, these elements are part of the techniques typically used for addressing memories, and a more detailed description would be outside the scope of the present invention.

Figure 4:
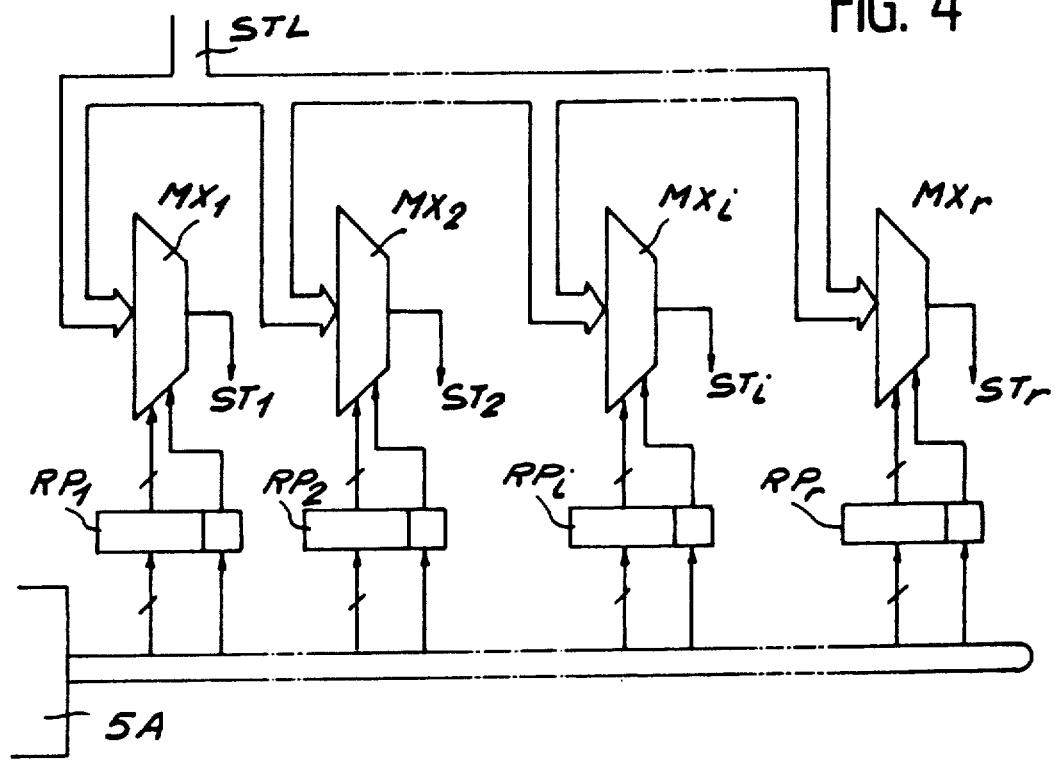
FIG. 4 represents a logical-to-physical conversion circuit for the signals output by the memory controller.

FIG. 4 shows the part of the conversion circuit 4 that relates to the selection signals ST, STL. This circuit includes as many multiplexers $MX_1, MX_2, \ldots, MX_i, \ldots, MX_r$ as the memory bus has connection sites. Each multiplexer receives at its input the signals STL, formed of logical selection signals $STL_1, \ldots, STL_n$. These multiplexers are associated respectively with physical configuration registers $RP_1, RP_2, \ldots, RP_i, \ldots, RP_r$. Each multiplexer $MX_i$ is commanded by the contents of its associated physical configuration register $RP_i$. Each register $RP_i$ may be loaded by the maintenance circuit 5A in response to the orders received from the service processor. The outputs of the multiplexers furnish the physical selection signals $ST_1, ST_2, \ldots, ST_i, \ldots, ST_r$ sent respectively to the connectors $C_1, C_2, \ldots, C_i, \ldots, C_r$ and hence intended for the physical modules $MU_1, MU_2, \ldots, MU_i, \ldots, MU_r$.

Figure 5:
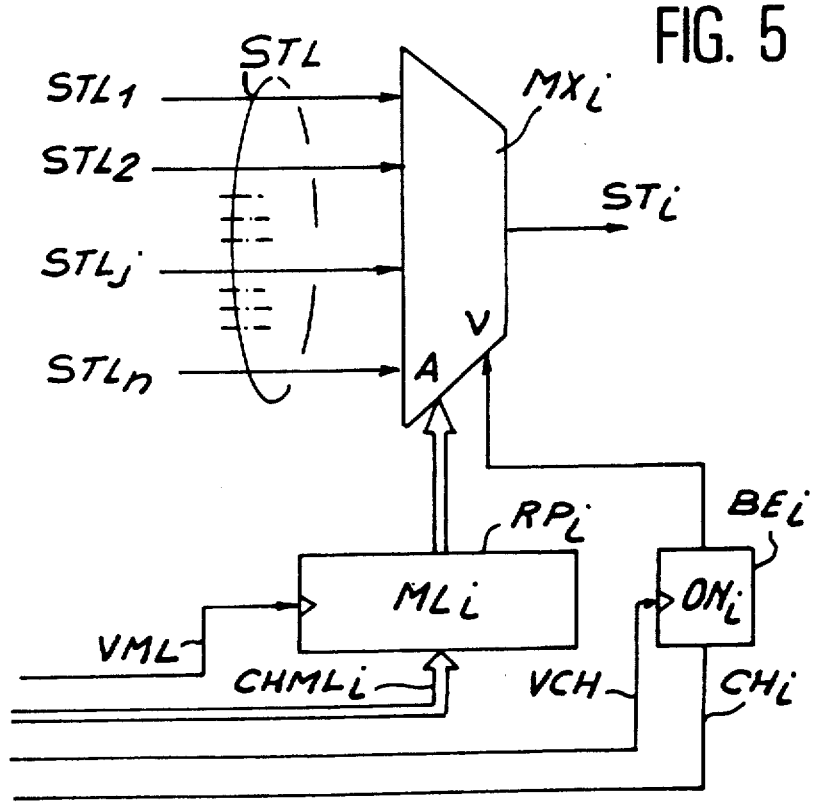
FIG. 5 shows a detail of the embodiment of the conversion circuit of FIG. 4.

Before the function of the circuit of FIG. 4 is explained, reference should be made to FIG. 5, which shows one of the multiplexers $MX_i$ and its associated physical configuration register $RP_i$ assigned to the physical module $MU_i$ in more detailed fashion. The multiplexer $MX_i$ includes n inputs $STL_1, STL_2, \ldots, STL_j, \ldots, STL_n$ and one output $ST_i$. As a function of the address signals applied to the input A of the multiplexer, the output $ST_i$ assumes the value of one of the inputs $STL_j$ when the validation signal applied to the validation input V is active. The physical configuration register $RP_i$ contains the number of the logical module MLi associated with the physical module $MU_i$. The register $RP_i$ is associated with a state multivibrator $BE_i$ the output of which is connected to the validation input V of the multiplexer $MX_i$. The multivibrator $BE_i$ contains the state indicator $ON_i$ associated with the physical module $MU_i$. The maintenance circuit 5A furnishes the register $RP_i$ and the multivibrator $BE_i$ with the input signals, CHMLI and CHI respectively, and the validation signals, VML and VCH, respectively.

Because of this arrangement, the service processor can load the register $RP_i$ with any number of logical module $ML_i$. Thus to make the logical module j correspond with the physical module $MU_i$, it suffices to force the contents $ML_i$ of the register $RP_i$ to the value j. In that case, the activation of the signal $STL_j$ will bring about the activation of the signal $ST_i$, enabling the selection of the physical module $MU_i$.

The conversion of the logical signals EDL and LDL into physical signals ED and LD can be done by means of circuits identical to those of FIG. 4. It is understood that the registers $RP_i$ and the state multivibrator $BE_i$ could be shared by the three conversion circuits.

To perform recopying of the contents of the module $MU_i$ associated initially with the logical module j and the replacement module $MU_r$, for example, the value j is first loaded into the register $RP_r$. The registers $RP_i$ and $RP_r$ associated with the modules $MU_i$ and $MU_r$, respectively, thus both contain the value j. This any writing request addressed to the logical module j will be physically addressed simultaneously to the modules $MU_i$ and $MU_r$. The ensuing description will now show how the case of reading is handled.

Figure 6:
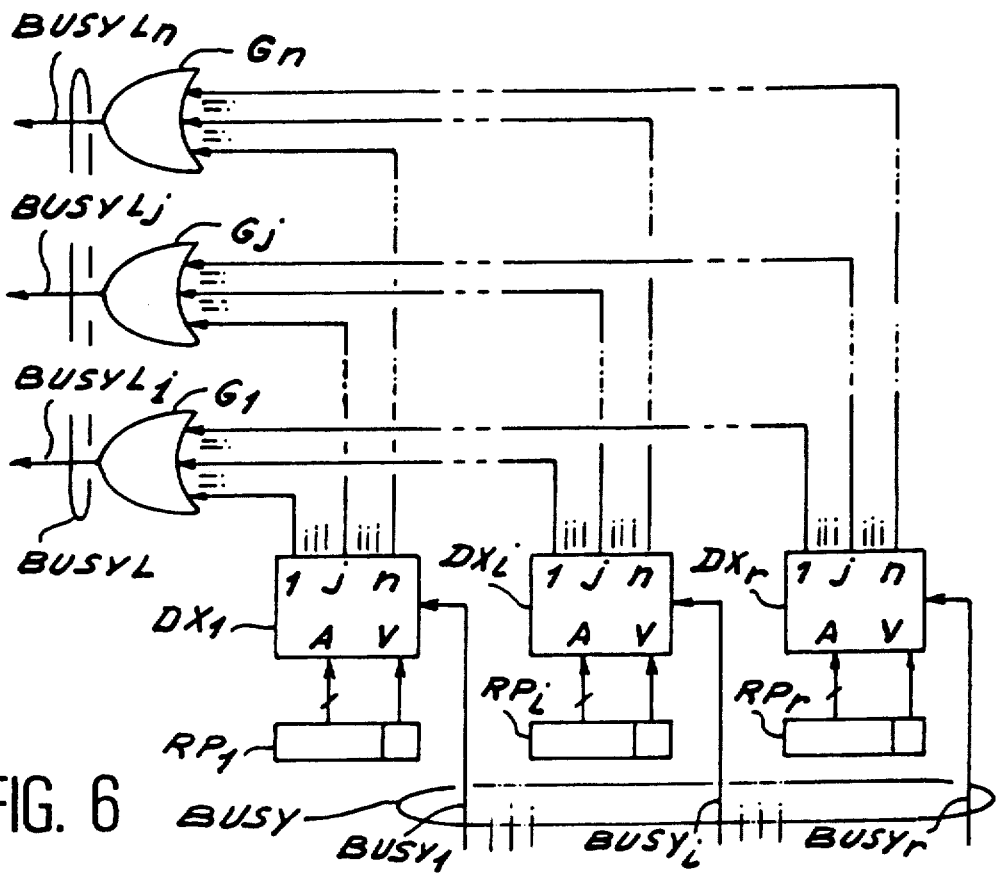
FIG. 6 shows a physical-to-logical conversion circuit for the signals received by the memory controller.

Now that the problem of converting the selection and command signals has been solved with the circuit of FIG. 4, a reference can be made to FIG. 6, relating to control signals, or in other words the signals output by the modules.

FIG. 6 shows an embodiment of the circuit enabling the conversion of busy signals $BUSY_i$ furnished by the modules. As in the circuit of FIG. 4, the physical configuration registers $RP_i$ are used. These registers command demultiplexers $Dx_1, \ldots, Dx_i, \ldots, Dx_r$ addressed respectively by the numbers of logical modules contained in the associated registers. Each demultiplexer $Dx_i$ is associated with one physical module $MU_i$ and at its input receives the busy signal $BUSY_i$ of this module. At its output, it furnishes a signal among n selected as a function of the address received at its address input A. On the other hand, the circuit includes logic gates $G_1, \ldots, G_i, \ldots, G_n$ connected to the outputs of the demultiplexers as follows: the inputs of the same rank j of the demultiplexers $Dx_l, \ldots, Dx_i, \ldots, Dx_r$ are connected to the input of a logic gate $G_j$ assigned this rank. Each logic gate $G_j$ furnishes the logical busy signal BUSYL. Assuming that the busy signal $BUSY_i$ of a module assumes the value of logical 1 when this module is occupied, the gates $G_j$ will be OR gates. Thus, in the course of recopying, two registers, for example $RP_i$ and $RP_r$, are loaded with the same logical number j. The corresponding demultiplexers $Dx_i$ and $Dx_r$ will transmit the busy signals $BUSY_i$ and $BUSY_r$ of these modules to the inputs of the same logic gate $G_j$. As a result, if any of the modules $MU_i$ or $MU_r$ is occupied, the output $BUSYL_j$ of the gate $G_j$ will assume the value of logical 1, thus preventing any selection of the logic module j and hence of the corresponding physical modules $MU_i$ and $MU_r$.

A similar circuit could be used to perform the conversion of the physical signals DOF into logical signals DOFL.

It has been seen above that recopying the contents of a module $MU_i$ into another module $MU_r$ is done by proceeding with reading and then rewriting of the entire memory space covered by the logic module j associated initially with the physical module $MU_i$. At the level of the physical modules, it is necessary that any reading relating to the logic module j in question must not be executed except by the module to be replaced $MU_i$, while any writing must be executed simultaneously in the module to be replaced $MU_i$ and in the replacement module $MU_r$. To permit this function, the replacement module must be marked in order to prevent any execution of reading of this module. To attain this object, various solutions are possible. For example, sending of any reading request to the replacement module could be inhibited. This could be done by forcing the validation signal of the multiplexer in question to 0, as a function of an indicator signalling the replacing status of the physical module associated, when a reading operation is performed (WR=0). To implement this solution, it would suffice to associate one mode multivibrator, the logic state of which indicates whether the associated physical module is a "titular" module or a replacement module, with each physical configuration register $RP_i$. The validation signal V of the multiplexer would then be a function of the logic state of the mode multivibrator, the logic state of the state multivibrator $BE_i$ and the read/write signal WR.

Nevertheless, this solution may present difficulties considering the following factors. Once the recopying is completed, the system must be restored to a new reconfiguration, where the replacement module becomes the titular one, while the module to be replaced becomes inactive. These changes in status are initialized by the service processor and executed by the maintenance circuit 5, which must return the state indicator $ON_i$, associated with the module $MU_i$ that is to be made inactive, to 0. On the other hand, the state of the mode multivibrator associated with the replacement module must be changed. Clearly, the changes in state of the multivibrators must be perfectly synchronized to avoid disturbance, if they occur during the execution of a memory access. However, despite this synchronization, the changes in state during the execution of a reading operation may present problems. In fact, reading typically takes place in several phases. The module to be replaced thus runs the risk of being invalidated before its data can be transmitted, while the replacement module has not received and hence has not executed any reading request. To avoid this problem, a control mechanism must accordingly be provided that permanently monitors all the reading operations being run, so as to authorize changes of state only outside the reading operations.

It is clear that such a mechanism represents a major complication in terms of implementation. This is why in a particular feature of the invention, a different solution has been adopted. In this solution, any request for either reading of writing is sent to both the module to be replaced and the replacement module. Nevertheless, in the case of reading, only the module to be replaced is authorized to effectively transmit the data accessed in this module. As a result, changes in status can occur in the course of reading without causing any loss of information.

Figure 7:
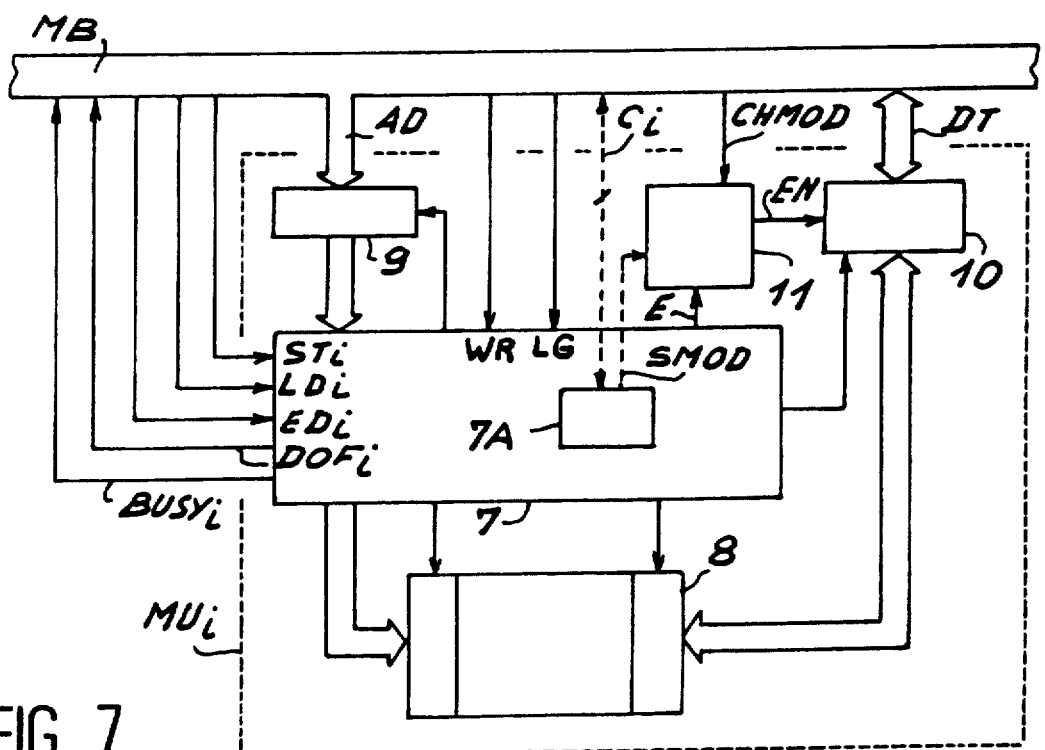
FIG. 7 shows a memory module and the primary signals that it exchanges with the bus.

The implementation of this solution will be explained in conjunction with FIG. 7, which shows one of the memory modules $MU_i$ as well as the main signals exchanged with the memory bus MB.

In a manner known per se, the module $MU_i$ includes memory circuits 8, generally comprising a plurality of components. The memory circuit 8 is associated with a controller 7, which furnishes it with the addresses and control signals necessary for executing reading or writing operations. The data DT are received by the memory circuit 8 after encoding by the error detection and correction circuit ECC. The controller 7 exchanges the signals $ST_i$, $LD_i$, $ED_i$, $DOF_i$, $BUSY_i$, WR, LG already defined above with the bus MB. On the other hand, it received address signals AD via a input buffer 9. The memory circuit 8 is connected to the bus MB via an interface circuit 10, essentially comprising input and output buffers and associated amplifiers. The controller 7 likewise includes a maintenance circuit 7A connected via the maintenance lines $C_i$ to the service processor SP to perform the maintenance operations.

In a particular characteristic of the invention, the module $MU_i$ is provided with an inhibition circuit 11 that, via a signal EN, commands the output amplifier of the interface 10 as a function of the following signals: a signal E originating in the controller 7, the signal CHMOD originating in the controller SCU, and the signal SMOD originating in the maintenance circuit 7A.

During normal function, the module $MU_i$ responds to the reading and writing requests received. Contrarily, if the module $MU_i$ is a replacement module, this status is signaled to the maintenance circuit SA by the service processor. The maintenance circuit 7A then activates the signal for setting in the replacing mode SMOD, which places the inhibition circuit 11 in condition to block any transmission of data over the interface circuit 10.

To restore the module $MU_i$ to its normal function, the status of the module $MU_i$ is modified by sending of the mode change signal CHMOD by the controller SCU. In response to the signal CHMOD, the inhibition circuit is returned to the condition to authorize the transmission of data.

Figure 8:
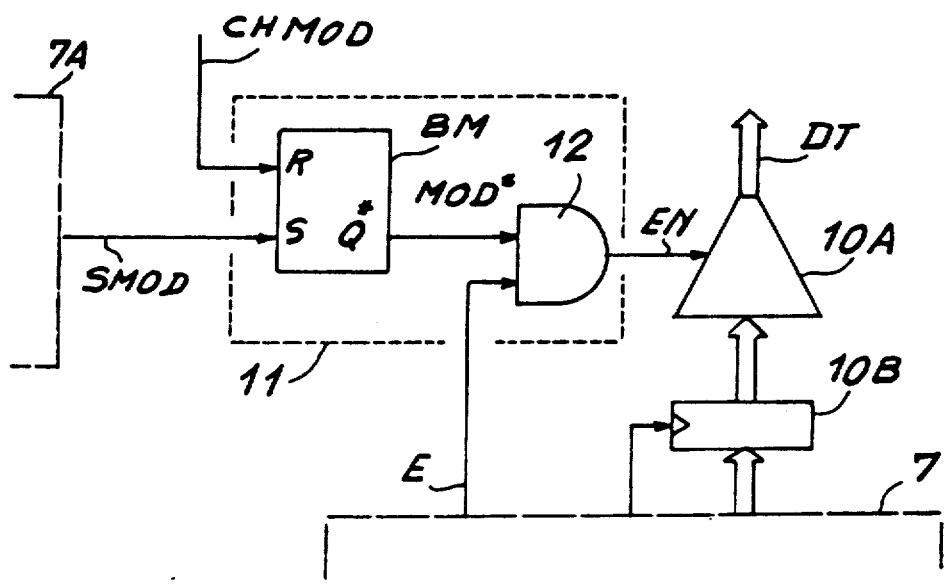
FIG. 8 shows a reading inhibition circuit of a memory module.

FIG. 8, in more detailed fashion, shows the inhibition circuit 11 with respect to the output amplifier 10A of the interface 10. In reading, the data originating in the error detection and correction circuit ECC are loaded into the output buffer 10B before being transmitted over the data lines DT of the bus MB by the output amplifier 10A. In a conventional memory module, the controller 7 of the module commands the output amplifier 10A via a transmission command signal E. When the module is not transmitting, the signal assumes a first logical value, which puts the amplifier 10A in the state of high impedance E. For a complementary value of this signal, the amplifier 10A is put in the active state, and the data contained in the buffer 10B are received by the data lines DT of the memory bus MB.

According to the invention, the output command signal E is no longer applied directly to the validation input of the amplifier 10 but rather via the inhibition circuit 11. The circuit 11 includes a mode multivibrator BM and a logic gate 12, the output EN of which is connected to the validation input of the amplifier 10A. On the other hand, the setting input S of the multivibrator BM receives the signal SMOD originating in the circuit 7A. The reset to zero input R of the multivibrator BM receives the signal CHMOD. It has been assumed that the amplifier 10A is at the high impedance state when its validation input receives the value of logical zero. On the other hand, it is assumed that when the mode multivibrator BM is in the logical 1 state, the associated module has the replacing status. The inverting output Q* of the multivibrator BM is then connected to the input of the AND gate 12, the second input of which receives the output command signal E originating in the controller 7.

The circuit of FIG. 8 functions as follows: when a replacement module has been connected to the bus MB, the service processor forces the signal SMOD to the value of logical 1. The multivibrator BM then assumes the state MOD=1, and the complementary signal MOD* is applied to the input of the gate 12. As a result, the output of this gate is at zero, which keeps the amplifier 10A in the high-impedance state, thus preventing the sending of all data read in the module. To modify the module status, the maintenance circuit 5A of the controller SCU puts the value CHMOD at the value of logical 1, which returns the multivibrator BM to zero. The amplifier 10A is then commanded normally by the signal E of the controller 7.

If the possibility of replacing only a single module at a time is sufficient, then there will be at most one module having the replacing status. The change in status can then be done by means of a single signal CHMOD common to all the modules. On the other hand, if the possibility of performing a plurality of replacements at once is to be retained, then the possibility of selectively sending a mode change signal CHMOD that is specific for each module must be provided. This solution can be implemented because of the circuit of FIG. 8, on the condition that as many mode change lines as there are memory bus connectors and means for selecting these lines are provided.

Figure 9:
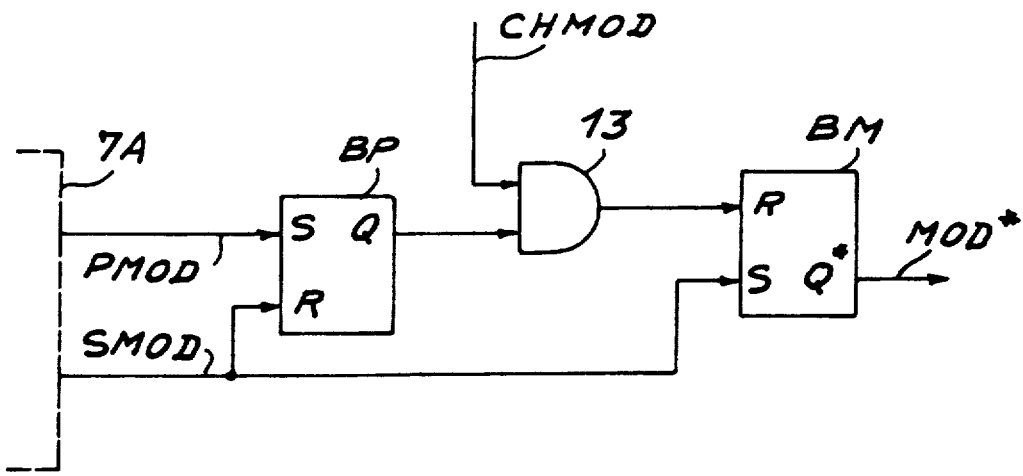
FIG. 9 shows another embodiment of the inhibition circuit.

FIG. 9 shows a variant embodiment of the inhibition circuit 11 enabling the simultaneous replacement of a plurality of modules while requiring only a single mode change line for mode change signed CHMOD. In FIG. 9, the mode multivibrator BM is seen, the setting input R of which receives the output signal of an AND gate 13, a first input of which receives the mode change signal CHMOD and a second input of which is connected to the non-inverting output Q of a presetting multivibrator BP. The setting input S of the multivibrator BP receives a presetting signal PMOD from the service processor while its reset to zero input R receives the signal SMOD. The setting input S of the mode multivibrator BM receives the signal SMOD, as in FIG. 8.

The function of the circuit of FIG. 9 is as follows. To return the mode multivibrator BM of a predetermined replacement module to zero, the service processor initially sets the presetting multivibrator BP to one via the signal PMOD. As a result, the AND gate 13 authorizes the transmission of the signal CHMOD. When the change in status is tripped in the maintenance circuit 5, the signal CHMOD is put to the value of logical 1 as before, which returns the mode multivibrator BM to 0. Thus the change in status of the module in question is performed to the exclusion of the other replacement modules, in which the presetting multivibrator BP is always at zero, which prevents the mode change signal from being taken into account.

One complete procedure for replacement of a module will now be described, initially with reference to the simplified case where only a single module is replaced at a time.

Normally, the replacement of a module $MU_i$ is instigated by the detection of a reading error ER by the error detection and correction circuit ECC of the controller SCU. This error is signaled to the service processor at the same time as the corresponding address. As a function of this information, the service processor can determine the number of logical modules associated with the defective physical module. Additionally, the defect is signaled to the user via the maintenance console of the service processor.

When the user wishes to perform the replacement, he puts a new replacement module $MU_r$ on the available connector. It should be noted that this operation is normally preceded by a preparatory procedure making it possible to perform this connection without disturbing the function of the system. To do so, one may for example proceed in accordance of the teaching of French Patent Application No. 88 16194, filed by the assignee of the present invention on Dec. 9, 1988, entitled "Systeme electronique a plusieurs units, amovibles" [Electronic System with a Plurality of Removable Unit's]. corresponding to U.S. application Ser. No. 444,941, filed Dec. 4, 1989. The contents of the aforementioned application are hereby incorporated by reference into the present description.

The user then orders the service processor to perform the recopying. The service processor then activates the following operations:

- via the maintenance circuit 7A, setting the mode multivibrator BM of the replacement module $MU_r$ to one, via the signal SMOD (FIG. 8);
- via the maintenance circuit 5A, loading of the physical configuration register $RP_r$ of the module $MU_r$ with the same logical module number as that associated with the defective module, and setting the associated state multivibrator $BE_r$ to 1 (FIG. 5);
- sending parameters to the processing means CPU to indicate the memory space in question and tripping of the program or microprogram for recopying into one of the processors (FIG. 1);
- taking into account the end of the recopying process signaled by the processing means;
- via the maintenance circuit 5A, setting the state multivibrator $BE_i$ associated with the module to be replaced to zero and simultaneously setting the mode change signal CHMOD to 1 (FIGS. 2, 5, 7, 8); and
- indicating via the maintenance console that the recopying is completed and that the defective board has been removed.

The user can then remove the defective board after having put the system in a condition to do so without disadvantage.

In the case where the ability to simultaneously replace a plurality of modules is desired, a procedure similar to that above is used, with the difference that the service processor must first be informed by the user by the identity of the physical modules manipulated. Further, the change in state of the mode multivibrator BM of the replacement module must be preceded by the setting of the presetting multivibrator BP (FIG. 9).

What is claimed is:

1. A method for replacement of one or more memory modules ($MU_i$) of a data processing system, each memory module having a plurality of memory locations, said modules ($MU_i$) communicating with a processing means (CPU) of the system via a bus (MB), said bus (MB) being provided with connection sites ($C_i$) to which said modules ($MU_i$) are connected, said method comprising:
   a) providing at least one supplementary connection site ($C_r$), in addition to connection sites (Ci) necessary for the system in its normal configuration,
   b) identifying a module to be replaced and connecting a replacement module ($MU_r$) to one of said supplementary connection sites ($C_r$),
   c) when addressing a writing request to said module to be replaced ($MU_i$), executing said writing request simultaneously by said module to be replaced ($MU_i$) and by its replacement module ($MU_r$), and when addressing a reading request to said module to be replaced ($MU_i$), authorizing only said module to be replaced ($MU_i$) to execute said reading request,
   d) starting a recopying process by sending a set of reading requests to a set of addresses corresponding to all memory locations of the module to be replaced, and then sending a set of rewriting requests to a set of addresses corresponding to all memory locations of the module to be replaced ($MU_i$) and the replacement module ($MU_r$),
   e) once said recopying process is completed, for any later request addressed to said module to be replaced ($MU_i$), authorizing only said replacement module ($MU_r$) to execute said later request.

2. The method of claim 1, further comprising executing said recopying process in parallel with other programs executed in the system.

3. The method of claim 2, wherein in order to authorize only the module to be replaced ($MU_i$) to execute the reading request, the reading request is sent to both the module to be replaced ($MU_i$) and the replacement module ($MU_r$), these two modules normally accessing data to be read, and sending of the accessed data by the replacement module ($MU_r$) is inhibited.

4. The method of claim 3, wherein a replacement module ($MU_r$) is marked by a mode indicator (MOD) signalling status of the marked replacement module as a replacement, and inhibition of the sending of accessed data is conditioned by presence of said mode indicator (MOD).

5. The method of claim 4, wherein said system includes n modules where n is the number of modules of the system in its normal configuration, and any request activates one signal among n, called a "logical selection signal" ($ST_j$), as a function of an associated address, and that each module effectively connected to the bus (MB) is capable of being commanded by a selection signal called a "physical selection signal" ($ST_i$), and said logical selection signal ($STL_j$) simultaneously activates two physical selection signals ($ST_i$, $ST_r$), applied respectively to said two modules ($MU_i$, $MU_r$), in order to enable simultaneously selecting two modules ($MU_i$, $MU_r$) in response to a predetermined request.

6. The method of claim 5, wherein a physical selection signal ($ST_i$) is transmitted to a module ($MU_i$) via a connection site ($C_i$), and each connection site ($C_i$) is linked with a state indicator ($ON_i$), and a physical selection signal ($ST_i$) is sent to a module ($MU_i$) only if the state indicator ($ON_i$) linked with the connection site ($C_i$) at which said module ($MU_i$) is placed has a predetermined logical value.

7. The method of claim 6, wherein in order to authorize only the replacement module ($MU_r$) to execute requests once the recopying process is complete, the logical value pertaining to the state indicator ($ON_i$) linked with the module to be replaced ($MU_i$) and the mode indicator (MOD) linked with the replacement module are modified.

8. The method of claim 2, wherein the memory modules ($MU_i$) are operatively associated with detection means and error correction means (ECC), and the replacement of a module ($MU_i$) is effected before errors detected in said replaced module ($MU_i$) are no longer correctable.

9. The method of claim 1, wherein in order to authorize only the module to be replaced ($MU_i$) to execute the reading request, the reading request is sent to both the module to be replaced ($MU_i$) and the replacement module ($MU_r$), these two modules normally accessing data to be read, and sending of the accessed data by the replacement module ($MU_r$) is inhibited.

10. The method of claim 9, wherein a replacement module ($MU_r$) is marked by a mode indicator (MOD) signalling status of the marked replacement module as a replacement, and inhibition of the sending of accessed data is conditioned by presence of said mode indicator (MOD).

11. The method of claim 10, wherein said system includes n modules where n is the number of modules of the system in its normal configuration, and any request activates one signal among n, called a "logical selection signal" ($STL_j$), as a function of an associated address, and that each module effectively connected to the bus (MB) is capable of being commanded by a selection signal called a "physical selection signal" ($ST_i$), and said logical selection signal ($STL_j$) simultaneously activates two physical selection signals ($ST_i$, $ST_r$), applied respectively to said two modules ($MU_i$, $MU_r$), in order to enable simultaneously selecting two modules ($MU_i$, $MU_r$) in response to a predetermined request.

12. The method of claim 11, wherein a physical selection signal ($ST_i$) is transmitted to a module ($MU_i$) via a connection site ($C_i$), and each connection site ($C_i$) is linked with a state indicator ($ON_i$), and that a physical selection signal ($ST_i$) is sent to a module ($MU_i$) only if the state indicator ($ON_i$) linked with the connection site ($C_i$) at which said module ($MU_i$) is placed has a predetermined logical value.

13. The method of claim 12, wherein in order to authorize only the replacement module ($MU_r$) to execute requests once the recopying process is complete, the logical value pertaining to the state indicator ($ON_i$) linked with the module to be replaced ($MU_i$) and the mode indicator (MOD) linked with the replacement module are modified.

14. The method of claim 9, further comprising executing said recopying process concurrently with other programs executed in the system.

15. The method of claim 1, wherein the memory modules ($MU_i$) are operatively associated with detection means and error correction means (ECC), and the replacement of a module ($MU_i$) is effected before errors detected in said replaced module ($MU_i$) are no longer correctable.

16. The method of claim 15, further comprising executing said recopying process concurrently with other programs executed in the system.

17. The method of claim 1, further comprising executing said recopying process concurrently with other programs executed in the system.

18. A data processing system including processing means (CPU) connected to a plurality of memory modules ($MU_i$) via a bus (MB), each memory module ($MU_i$) having a plurality of memory locations, said bus (MB) being provided with connection sites ($C_i$) to which said modules ($MU_i$) are connected, said system including command means (SCU, 11) for selecting said modules ($MU_i$) in response to addresses linked with memory access requests issued by said processing means (CPU), maintenance means (SP) connected to said system for initializing the system and performing maintenance operations, said system comprising:
 a) at least one supplementary connection site ($C_r$), for receiving replacement modules ($MU_r$), in addition to the connection sites ($C_i$) necessary for the system in its normal configuration,
 b) means for addressing a writing request to a module ($MU_i$) and enabling replacement of the addressed module ($MU_i$) with another module ($MU_r$), means for setting said command means (SCU, 11) by the maintenance device (SP) such that:
 any writing request addressed to a module ($MU_i$) to be replaced by a replacement module ($MU_r$) is executed simultaneously and at the address of the writing request by both said module to be replaced ($MU_i$) and the replacement module ($MU_r$) linked thereto, and
 any reading request addressed to said module to be replaced ($MU_i$) is executed by only said module to be replaced ($MU_i$), and
 c) means for executing, on command of said maintenance device (SP), a recopying process by sending reading requests to a set of addresses covering all of the memory locations of the module ($MU_i$) to be replaced, and then sending rewriting requests to all memory locations of the module to be replaced ($MU_i$) and the replacement module ($MU_r$).

19. The data processing system of claim 18, wherein said means for executing said recopying process comprise a program or microprogram loaded into said processing means (CPU), and means for executing said program or microprogram in parallel with other programs being run simultaneously in said processing means (CPU).

20. The data processing system of claim 19, wherein said command means (SCU, 11) include a selection circuit (SCA, 4) to generate physical selection signals ($ST_i$) of the modules ($MU_i$) as a function of addresses associated with the requests, means for setting said selection circuit (SCA, 4) by the maintenance device (SP) such that, for a set of addresses corresponding to a predetermined module ($MU_i$), in response to any address of said set, said selection circuit (SCA, 4) generates both a physical selection signal ($ST_i$) of said predetermined module ($MU_i$) and a physical selection signal ($ST_r$) of another module ($MU_r$), and that said command means (SCU, 11) include inhibiting means (11) capable of being set by the maintenance device (SP) such as to prevent at least one arbitrary module ($MU_r$) from performing transmission of data read in said arbitrary module ($MU_r$).

21. The data processing system of claim 20, wherein the inhibition means (11) comprise inhibition circuits (11) assigned respectively to the memory modules ($MU_i$), said inhibition circuit (11) of a module including a mode multivibrator (BM), which for a first predetermined logic state directs the inhibition of transmission of data read in said module ($MU_i$), and that said mode multivibrator (BM) of an arbitrary module may be placed in said first logic state by the maintenance device (SP).

22. The data processing system of claim 21, wherein the system includes n modules ($MU_i$) where n is the number of modules of the system in its normal configuration, and said selection circuit (SCA, 4) includes a logical selection circuit (SCA), which as a function of an address associated with any request, generates a signal among n, called a "logical selection signal" ($STL_j$), and said selection circuit (SCA, 4) includes a conversion circuit (4), which in response to a logical selection signal ($STL_j$), and depending on the setting imposed by the maintenance device (SP), generates one or more physical selection signals ($ST_i$, $ST_r$) intended respectively for one or more modules ($MU_i$, $MU_r$).

23. The data processing system of claim 22, including means for transmitting a physical selection signal ($ST_i$) to a module ($MU_i$) via a connection site ($C_i$), and each connection site ($C_i$) being operatively connected with a state multivibrator ($ON_i$), having a logic state which is set by the maintenance device (SP), and means for sending a physical selection signal ($ST_i$) to a module ($MU_i$) only of a state multivibrator ($ON_i$) associated with the connection site ($C_i$) at which said module ($MU_i$) and which is placed is in a predetermined first logic state.

24. The data processing system of claim 23, wherein said command means (SCU) include a mode changing circuit (5), which generates a mode changing signal (CHMOD) when one of the state multivibrators ($ON_i$) is placed in a second predetermined logic state, and means for applying said mode changing signal (CHMOD) to said inhibition circuit (11) of each module ($MU_i$), such that said inhibition circuit (11) then places its mode multivibrator (BM) in a second logic state.

25. The data processing system of claim 18, wherein said command means (SCU, 11) include a selection circuit (SCA, 4) to generate physical selection signals ($ST_i$) of the modules ($MU_i$) as a function of addresses associated with the requests, means for setting said selection circuit (SCA, 4) by the maintenance device (SP) such that, for a set of addresses corresponding to a predetermined module ($MU_i$), in response to any address of said set, said selection circuit (SCA, 4) generates both a physical selection signal ($ST_i$) of said predetermined module ($MU_i$) and a physical selection signal ($ST_r$) of another module ($MU_r$), and that said command means (SCU, 11) include inhibiting means (11) capable of being set by the maintenance device (SP) such as to prevent at least one arbitrary module ($MU_r$) from performing transmission of data read in said arbitrary module ($MU_r$).

26. The data processing system of claim 25, wherein the inhibition means (11) comprise inhibition circuits (11) assigned respectively to the memory modules (MU$_j$), said inhibition circuit (11) of a module including a mode multivibrator (BM), which for a first predetermined logic state directs the inhibition of transmission of data read in said module (MU$_j$), and that said mode multivibrator (BM) of an arbitrary module may be placed in said first logic state by the maintenance device (SP).

27. The data processing system of claim 26, wherein the system includes n modules (MU$_i$) where n is the number of modules of the system in its normal configuration, and said selection circuit (SCA, 4) includes a logical selection circuit (SCA), which as a function of an address associated with any request, generates a signal among n, called a "logical selection signal" (STL$_j$), and said selection circuit (SCA, 4) includes a conversion circuit (4), which in response to a logical selection signal (STL$_j$), and depending on the setting imposed by the maintenance device (SP), generates one or more physical selection signals (ST$_i$, ST$_r$) intended respectively for one or more modules (MU$_i$, MU$_r$).

28. The data processing system of claim 27, including means for transmitting a physical selection signal (ST$_i$) to a module (MU$_i$) via a connection site (C$_i$), and each connection site (C$_i$) being operatively connected with a state multivibrator (ON$_i$), having a logic state which is set by the maintenance device (SP), and means for sending a physical selection signal (ST$_i$) to a module (MU$_i$) only of a state multivibrator (ON$_i$) linked with the connection site (C$_i$) at which said module (MU$_i$) is placed and which is in a predetermined first logic state.

29. The data processing system of claim 28, wherein said command means (SCU) include a mode changing circuit (5), which generates a mode changing signal (CHMOD) when one of the state multivibrators (ON$_i$) is placed in a second predetermined logic state, and means for applying said mode changing signal (CHMOD) to said inhibition circuit (11) of each module (MU$_i$), such that said inhibition circuit (11) then places its mode multivibrator (BM) in a second logic state.

* * * * *

UNITED STATES PATENT AND TRADEMARK OFFICE
CERTIFICATE OF CORRECTION

PATENT NO. : 5,235,687
DATED : August 10, 1993
INVENTOR(S) : Pierre BACOT et al

It is certified that error appears in the above-indentified patent and that said Letters Patent is hereby corrected as shown below:

Col. 15, line 65 (Claim 5, line 5) "(STj)" should be --(STLj)--.

Signed and Sealed this

Eleventh Day of October, 1994

Attest:

BRUCE LEHMAN

Attesting Officer     Commissioner of Patents and Trademarks